United States Patent
Rangsten et al.

(10) Patent No.: US 8,395,057 B2
(45) Date of Patent: Mar. 12, 2013

(54) SUBSTRATE-PENETRATING ELECTRICAL CONNECTIONS

(75) Inventors: Pelle Rangsten, Storvreta (SE); Hakan Johansson, Uppsala (SE); Johan Bejhed, Uppsala (SE)

(73) Assignee: NanoSpace AB, Uppsala (SE)

( * ) Notice: Subject to any disclaimer, the term of this patent is extended or adjusted under 35 U.S.C. 154(b) by 415 days.

(21) Appl. No.: 12/439,568

(22) PCT Filed: Sep. 4, 2007

(86) PCT No.: PCT/SE2007/050617
§ 371 (c)(1),
(2), (4) Date: Mar. 2, 2009

(87) PCT Pub. No.: WO2008/030176
PCT Pub. Date: Mar. 13, 2008

(65) Prior Publication Data
US 2010/0018764 A1    Jan. 28, 2010

(30) Foreign Application Priority Data

Sep. 4, 2006 (SE) ...................................... 0601832

(51) Int. Cl.
*H05K 1/11* (2006.01)
*H05K 1/09* (2006.01)
*H01L 23/48* (2006.01)
*H01L 21/44* (2006.01)

(52) U.S. Cl. ........ 174/264; 174/257; 174/263; 174/265; 257/774; 438/667; 438/684

(58) Field of Classification Search .................. 257/621, 257/774, 777, 773; 438/598, 667, 684; 439/75; 174/264, 257, 265, 263; 29/846
See application file for complete search history.

(56) References Cited

U.S. PATENT DOCUMENTS

| | | | |
|---|---|---|---|
| 3,846,741 A | 11/1974 | Kunkle | |
| 4,394,712 A * | 7/1983 | Anthony | 361/779 |
| 6,208,156 B1 * | 3/2001 | Hembree | 324/750.25 |
| 6,294,837 B1 * | 9/2001 | Akram et al. | 257/774 |
| 6,577,013 B1 | 6/2003 | Glenn | |
| 6,716,737 B2 * | 4/2004 | Plas et al. | 438/612 |
| 2003/0022475 A1 * | 1/2003 | Vieux-Rochaz et al. | 438/598 |
| 2003/0060000 A1 * | 3/2003 | Umetsu et al. | 438/200 |
| 2003/0210534 A1 * | 11/2003 | Swan et al. | 361/807 |

(Continued)

OTHER PUBLICATIONS

International Search Report dated Dec. 27, 2007, in PCT application.

*Primary Examiner* — Timothy Thompson
*Assistant Examiner* — Sherman Ng
(74) *Attorney, Agent, or Firm* — Young & Thompson

(57) ABSTRACT

A wafer assembly (30) includes a substrate (71), in turn including a wafer (70) or a stack of wafers. The wafer assembly (30) further includes an electrical connection (32) arranged through at least a part of the substrate (71). The electrical connection (32) is made by low-resistance silicon. The electrical connection (32) is positioned in a hole (84) penetrating at least a part of the substrate (71). A surface (78) of the substrate (71) confining the hole (84) is electrically insulating. The electrical connection (32) has at least one protrusion (75), which protrudes transversally to a main extension (83) of the hole (84) and the protrusion (75) protrudes outside a minimum hole diameter (85), as projected in the main extension (83) of the hole (84). Preferably, the protrusion (75) is supported by a support surface (81) of the substrate (71). A manufacturing method is also disclosed.

19 Claims, 6 Drawing Sheets

U.S. PATENT DOCUMENTS

| | | | |
|---|---|---|---|
| 2005/0029630 A1* | 2/2005 | Matsuo | 257/628 |
| 2005/0127478 A1* | 6/2005 | Hiatt et al. | 257/621 |
| 2005/0186777 A1* | 8/2005 | Kirby et al. | 438/629 |
| 2006/0043599 A1* | 3/2006 | Akram et al. | 257/774 |
| 2006/0046468 A1* | 3/2006 | Akram et al. | 438/637 |
| 2006/0166526 A1 | 7/2006 | Lee | |
| 2006/0181295 A1* | 8/2006 | Kirby | 324/755 |
| 2006/0290001 A1* | 12/2006 | Sulfridge | 257/774 |
| 2007/0020926 A1* | 1/2007 | Kalvesten et al. | 438/667 |

* cited by examiner

SUBSTRATE-PENETRATING ELECTRICAL CONNECTIONS

TECHNICAL FIELD

The present invention relates in general to electrical connections through a wafer substrate and manufacturing thereof.

BACKGROUND

Semiconducting or conducting wafers or stacks of wafers are today used for many types of equipment. The most conventional use of wafers is to act as a mechanical support for electronic equipment. In recent years, when also mechanical systems have become miniaturized, wafers are also used for more mechanical purposes, acting as supports and or parts of the actual mechanical systems. MEMS (Micro Electro Mechanical System) technology is today used for producing many kinds of mechanical or combined mechanical and electrical systems.

In most applications, the wafer assemblies are provided with different types of electrical equipment, and there is typically a need for providing electrical contact between the different sides of a wafer, or between different surfaces in a wafer stack. There is a need for electrical connections or vias through or around the wafer assembly. In prior art, electrical connections are typically provided by inserting a metal pin through a hole provided through a wafer. The pin is electrically connected at each side of the wafer. However, when the electrical structures become smaller and smaller, the handling of such electrical connections becomes difficult, due to the small dimensions. Also, electrical connections based on metal pins are difficult to make vacuum tight. One approach is then to manufacture an electrical connection directly based on the wafer. One example of how such an electrical connection can be provided in prior art can be found e.g. in the published U.S. patent application 2003/0022475.

Furthermore, in many applications today, several wafers are provided on top of each other in a wafer stack, possibly bonded together. Electrical connections are often provided between different surfaces of these wafers. During the bonding process, the wafers are heated to high temperatures, which means that it is difficult to provide soldered electrical connections or electrical connections comprising metals of low melting temperature before the bonding process. Furthermore, if metal electrical connections are used the thermal expansion differs between the wafer and the electrical connections. In particular for electrical connections through multiwafer stacks, the difference in thermal expansion can be considerable, which leads to mechanical stress of the connections. This is particularly important, e.g. during bonding processes or other high temperature treatments. In the published U.S. patent application 2007/0020926, electrical connections consisting of low-resistance silicon is manufactured from the wafer itself. The use of low-resistance silicon as electrical connection material solves some of the above mentioned problems. The thermal expansion of the electrical connections becomes identical to the thermal expansion of the wafer, which removes any mechanical strain upon heating the treatment. However, the solution of U.S. 2007/0020926 is not very easily applicable on multiwafer stacks. The solution is also only applicable in cases where the electrical connection can be made in the same material as the main substrate.

One remaining problem with electrical connection solutions according to prior art is that they are incompatible with high-temperature treatments of wafers and wafer stacks. Furthermore, reliable mechanical connections of external mechanical or electrical parts to the electrical connections are difficult to provide. Also, electrical connections can not be provided in systems where the main substrate comprises a material that is not suitable to be utilized as an electrical connection material.

SUMMARY

A general object of the present invention is therefore to provide improved electrical connections through a wafer and manufacturing methods therefore, and in particular electrical connections that can be used in multiwafer stacks. A further object is to provide electrical connections that are possible to connect after any final high-temperature treatment of the wafer, e.g. in connection with bonding of a wafer stack. Another further object is to provide electrical connections that can be made vacuum tight. Yet another object is to provide electrical connections in wafer assemblies using wafers having a material that is not suitable to be used as electrical connections.

The above objects are achieved by devices and methods according to the enclosed patent claims. In general words, according to a first aspect, a wafer assembly comprises a substrate, in turn comprising a wafer or a stack of wafers. The wafer assembly further comprises an electrical connection arranged through at least a part of the substrate. The electrical connection is made by low-resistance silicon. The electrical connection is positioned in a hole penetrating at least a part of the substrate. A surface of the substrate confining the hole is electrically insulating. The electrical connection has at least one protrusion, which protrudes transversally to a main extension of the hole and the protrusion protrudes outside a minimum hole diameter, as projected in the main extension of the hole. Preferably, the protrusion is supported by a support surface of the substrate.

According to a second aspect, a method for manufacturing an electrical connection through a substrate comprises providing of a substrate comprising a wafer or a stack of wafers, creating a hole penetrating at least a part of the substrate and making a surface of the substrate confining the hole electrically insulating. The method is characterised by providing an electrical connection in low-resistance silicon and putting the electrical connection into the hole. The electrical connection is positioned in the hole such that a protrusion of the electrical connection, protrudes transversal to a main extension of the hole, whereby the protrusion being arranged for protruding outside a minimum hole diameter as projected in the main extension of the hole. The protrusion is preferably supported by a support surface of the substrate.

One advantage with the present invention is that provision of electrical connections can be completed after any final high-temperature treatment of the wafer assembly, even into interior volumes of a wafer stack. The electrical connections are also easily made vacuum tight. The present invention also provides possibilities to mechanically reliable connections to external parts.

BRIEF DESCRIPTION OF THE DRAWINGS

The invention, together with further objects and advantages thereof, may best be understood by making reference to the following description taken together with the accompanying drawings, in which.

DETAILED DESCRIPTION

Throughout the present disclosures, equal or directly corresponding features in different figures and embodiments will be denoted by the same reference numbers.

Figure 1:
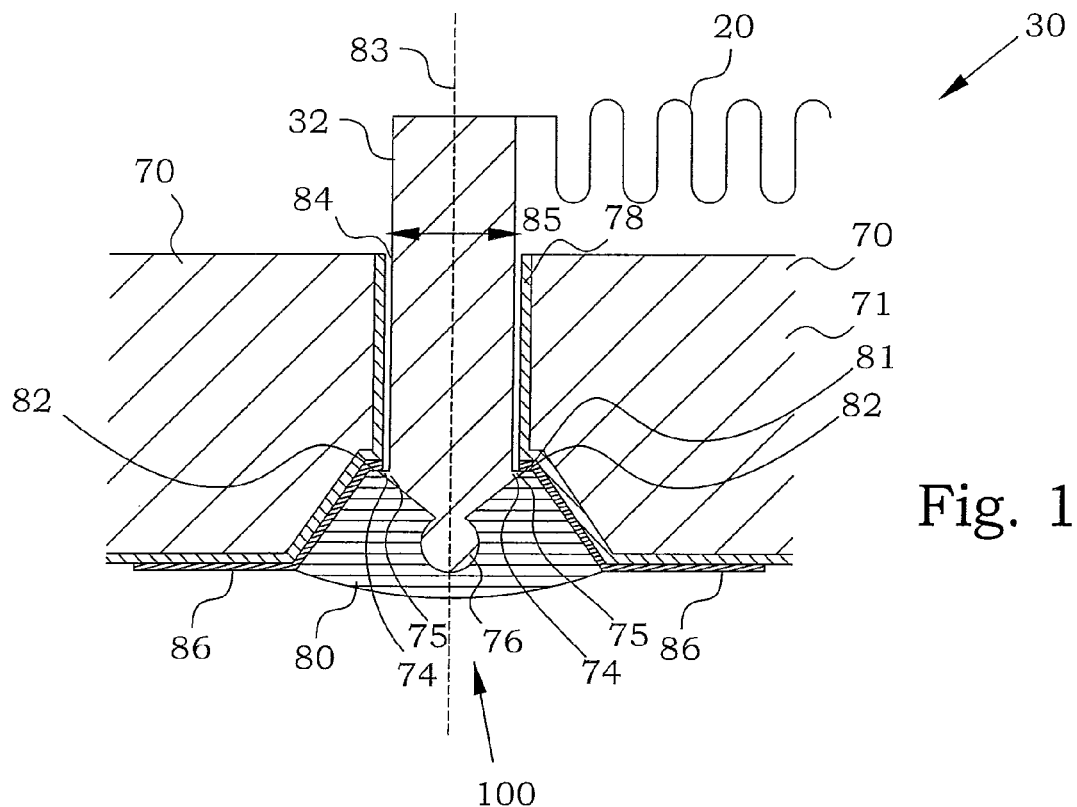
FIG. 1 is a schematic drawing illustrating an embodiment of a wafer assembly according to the present invention.

An embodiment of a wafer assembly 30 according to the present invention is illustrated in FIG. 1. This particular embodiment is intended to be used for a heater arrangement in a gas thruster equipment, supporting a heater microstructure 20. A substrate 71, in this embodiment provided as a silicon wafer 70, in which a hole 84 is created. An electrical connection 32 or has a general elongated form and is positioned in the hole 84 penetrating through the substrate 71 and provides thereby an electrical connection through at least a part of said substrate 71. The electrical connection 32 in the present embodiment is provided with small hooks 74 close to the bottom end. The general dimension of the electrical connection 32 is adapted to just fit into a hole 84 in the wafer 70. The edges of the hooks 74 are dimensioned for being slightly larger than the hole 84 dimension. In such a way, the electrical connection 32 can be forced through the hole 84, but when the hooks 74 penetrates out from the hole 84, the edges prohibits the electric connection 32 to be removed again. The electrical connection 32 is thus first manufactured or provided and then put into the hole 84. The electrical connection 32 has in other words a protrusion 75, in the present embodiment the hooks 74, protruding transversal to a main extension 83 of said hole 84. The protrusion 75 thus protrudes outside a minimum hole diameter 85 as projected in the main extension 83 of the hole 84. The hooks 74 have a respective surface transversal to the main extension 83 of the hole 83 facing towards the minimum hole diameter. In the present embodiment, the edges of the hooks 74 thereby rest against a support surface 81 of the substrate, in the present embodiment an edge 82 of the wafer, at the exit of the hole 84. This ensures a mechanical stability.

The electric connection 32 is manufactured in low-resistance silicon and is therefore conducting. The use of low-resistance silicon as electrical connections 32 in vias solves many problems. The thermal expansion of the via structure 100 becomes identical to the thermal expansion of the wafer 70, which removes any mechanical strain upon heating the treatment. Furthermore, since the geometrical shape of vias 100 based on silicon can be tailored with a very high accuracy, hooks 74 or other retaining means can be provided to ensure mechanical connections. Here MEMS technologies can preferably be used for the manufacturing of the electrical connections 32.

In order to prohibit any electrical contact directly between the electrical connection 32 and the silicon wafer 70, the surface 78 of the hole 84 as well as areas in the vicinity of the hole 84 openings are oxidized, giving rise to a layer of insulating silicon oxide. In other words, a surface 78 of the substrate 71 confining the hole 84 is electrically insulating. At the lower orifice of the hole 84, the wafer 70 is provided with a thin metal layer 86, having a vacuum tight adhesion to the silicon wafer 70. The support surface 81 is thereby a metallised surface. A solder material 80 is deposited over the end 76 of the electrical connection 32 and heated until the solder material 80 wets against the end 76 as well as against the thin metal layer 86. Preferably, the heating can be performed by sending an electric current through the thin metal layer 86. In such a way, both an electrical connection and a vacuum seal are provided in a simple way, without need for traditional soldering processes. The adhesion properties can be enhanced by shaping the end 76, e.g. as a sphere as shown in the figure, for providing a geometrical structure that provides enhanced strength to the adhesion to the end 76.

As seen in FIG. 1, the orifice of the hole at the bottom side is provided in a recess in the wafer, i.e. the support surface 81 of the substrate 71 is a recessed surface portion of the substrate 71. This makes it possible to contain the entire electrical connection 32 within the main surface plane of the wafer 70, which reduces risks for mechanical damages.

However, in other situation, it might be an advantage that the electrical connection 32 protrudes outside the main surface plane of the wafer 70. This is e.g. the situation at the upper part of the electrical connection 32 in FIG. 1, where a simple connection to the heater microstructure 20 is provided due to the fact that the electrical connection 32 sticks out from the wafer 70 surface. This is possible to manufacture since the electrical connections 32 are produced separate from the wafer 70 and thus doesn't need to have the same dimensions.

Figure 2:
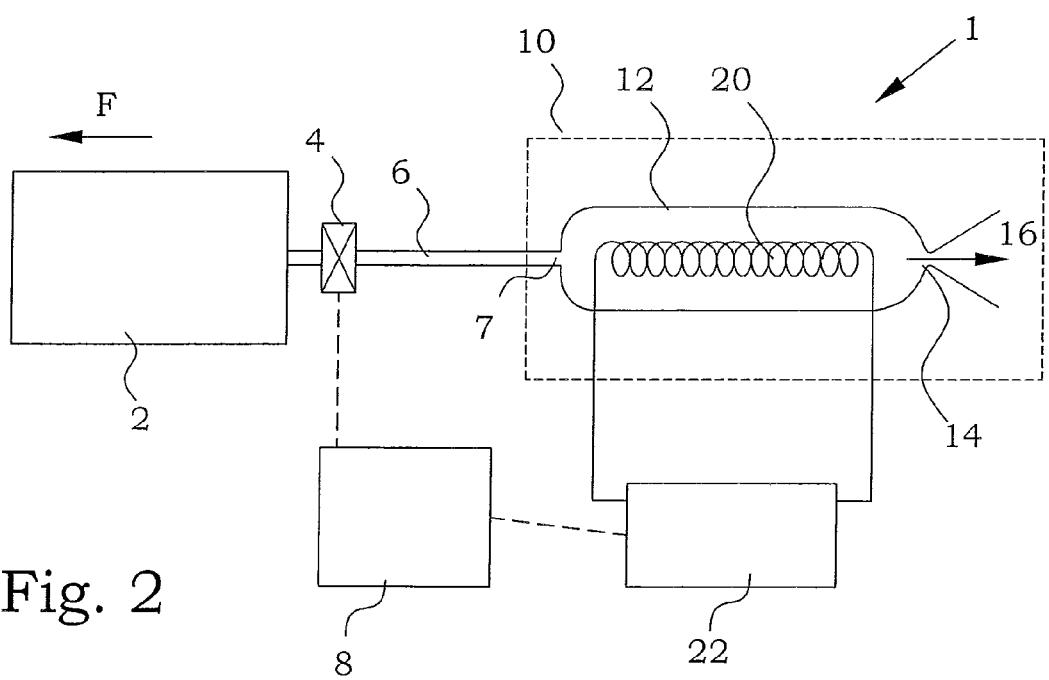
FIG. 2 is a schematic drawing of a gas thruster in which the wafer assembly of FIG. 1 may be used.

The wafer assembly of FIG. 1 is intended to be included for attaching a heater microstructure in a gas thruster equipment. FIG. 2 illustrates schematically an embodiment of a gas thruster 1, operating with heating of the gas. The gas thruster 1 comprises a container containing driving material, in the present embodiment a gas storage 2, typically capable of storing gas under high pressure. A valve arrangement, in the present embodiment a gas valve 4 regulates the flow of gas from the gas storage 2, through an inlet pipe 6, to a nozzle arrangement 10. The gas valve is typically controlled by a flow control unit 8. The nozzle arrangement 10 in turn comprises a stagnation chamber 12 in an entrance opening 7 of which the inlet pipe 6 discharges. The opposite side of the stagnation chamber 12 is formed as a nozzle exit 14 in order to increase the speed and thereby the momentum of the gas 16 exiting the stagnation chamber 12. The stagnation chamber 12 further comprises a heater microstructure 20, in this embodiment depicted as a heater coil, which heats the gas within the stagnation chamber and thereby increases the efficiency of the gas flowing out from the gas storage 2. The heater microstructure 20 is controlled by a heater control unit 22, preferably connected to the flow control unit 8 for adapting the power inserted into the gas as heat, depending on the gas flow rate. The gas thruster 1 of FIG. 2 can thereby apply a force to any device mechanically coupled to the gas thruster directed in an opposite direction F to the direction 16 of the gas streaming out from the gas thruster 1.

Figure 3:
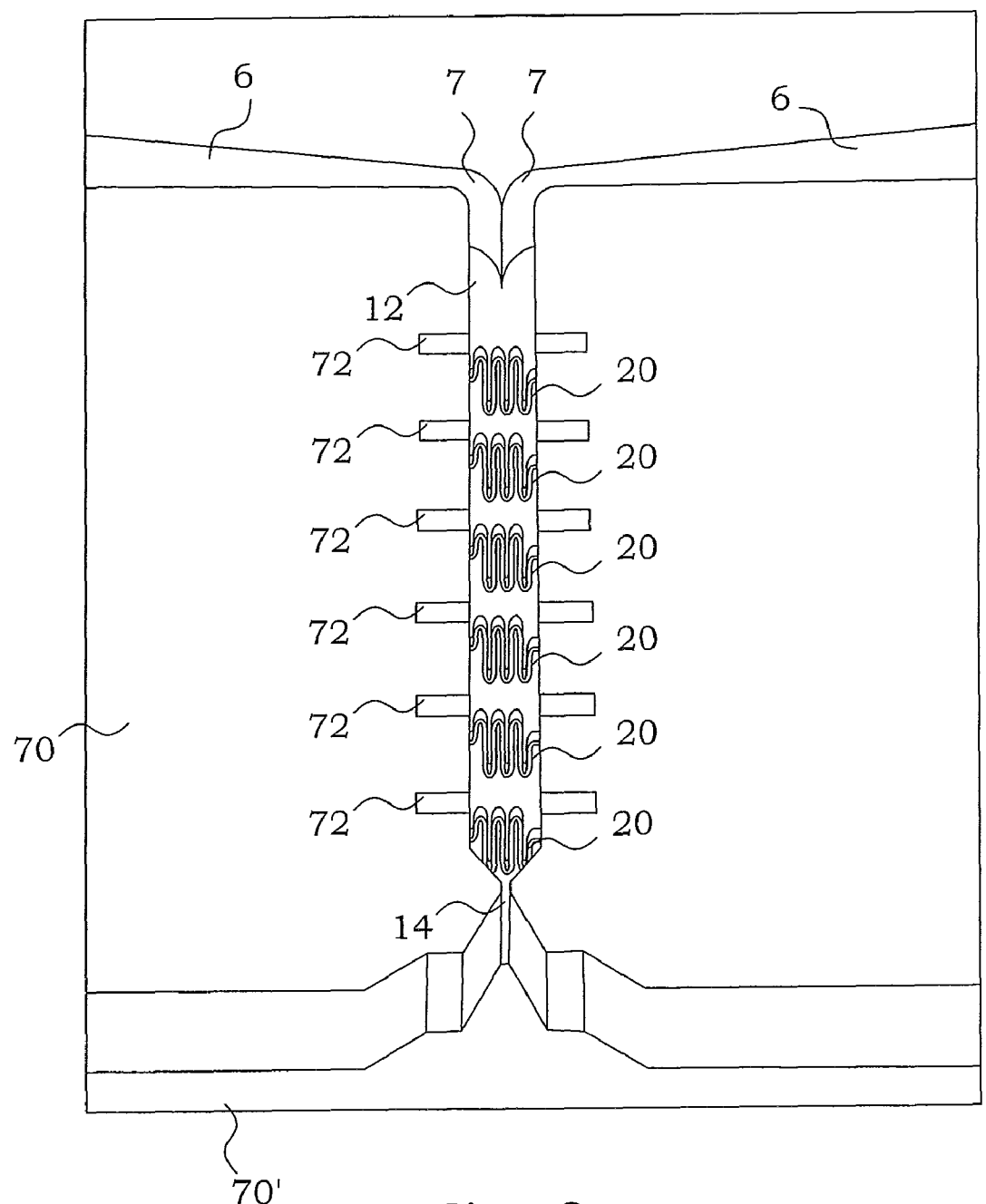
FIG. 3 is an elevation view of a stagnation chamber in which the wafer assembly of FIG. 1 may be used.

In FIG. 3, a stagnation chamber 12 with six heater microstructures 20 mounted in series is illustrated. The stagnation chamber is produced in a silicon wafer 70. The heater microstructures 20 are mounted into grooves 72 in the silicon wafer, where holes in an underlying silicon wafer 70' are provided for the electrical connections according to the principles of FIG. 1. In such a way, the electrical connection can be provided from the backside of the silicon wafer, external of the stagnation chamber.

A few non-exclusive examples of vias according to embodiments of the present invention are presented below. However, anyone skilled in the art realises that there are many other variants and modifications of the same basic principles that are possible to utilize.

Figure 4:
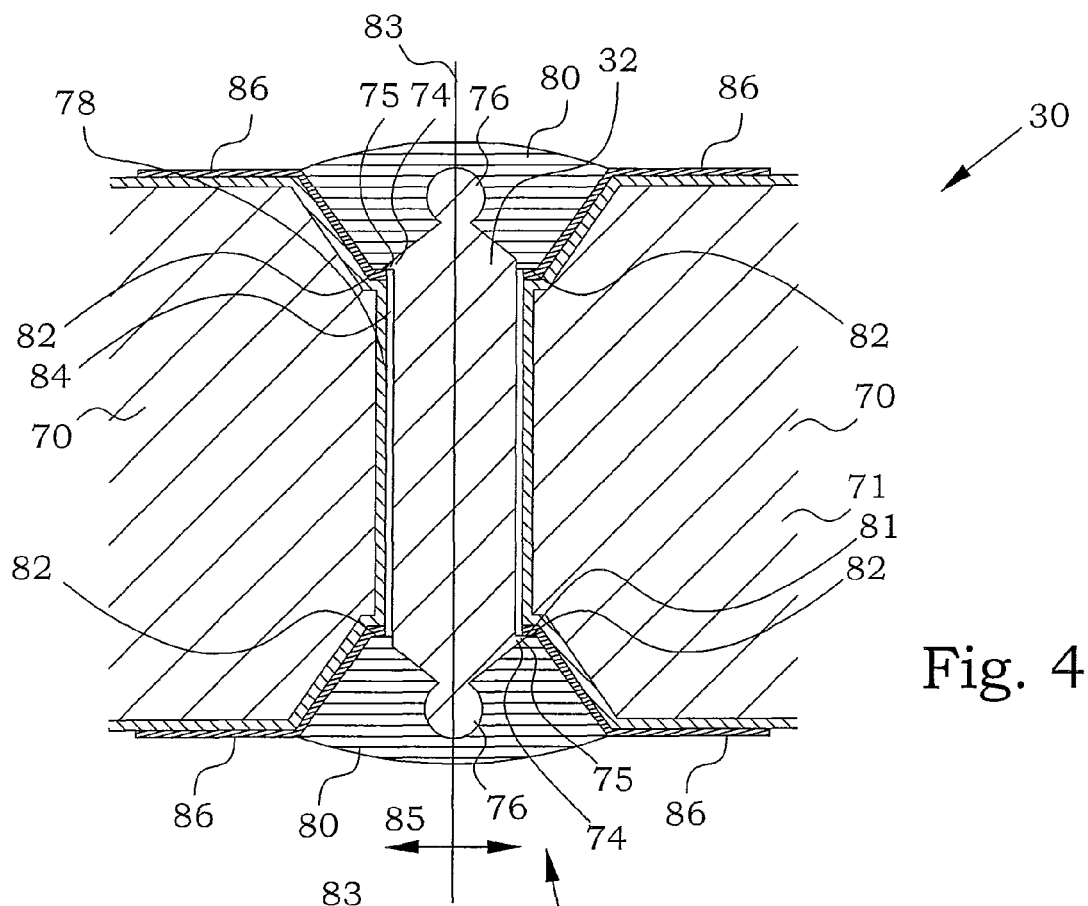
FIG. 4 is a schematic drawing of another embodiment of a wafer assembly according to the present invention.

In FIG. 4, a via 100 comprising an electrical connection 32 of low-resistance silicon is inserted through a hole 84 in a substrate 71, in this case a single wafer 70. The electrical connection 32 of the via 100 has a hook 74 in the vicinity of each end 76 thereof. The electrical connection 32 has thus a protrusion at each side of the hole 84 in a direction of the main extension 83 of the hole 84. In this embodiment, there is however only one hook 74 at each end, which facilitates the insertion through the hole 84. The hole 84 is covered by a silicon oxide layer in order to prohibit electrical shortening towards the wafer 70. At each orifice of the hole 84, the wafer 70 presents a recess, in which an edge 82 is provided, against which the hook 74 is intended to rest. The recess and an area around the recess is also covered by a metal film 86 assisting in ensuring a good adhesion and a vacuum tight seal. The metal film 86 can also be used for heating the solder material when creating the solder, as well as an electrical lead to the via 100 for operational purposes.

Figure 5:
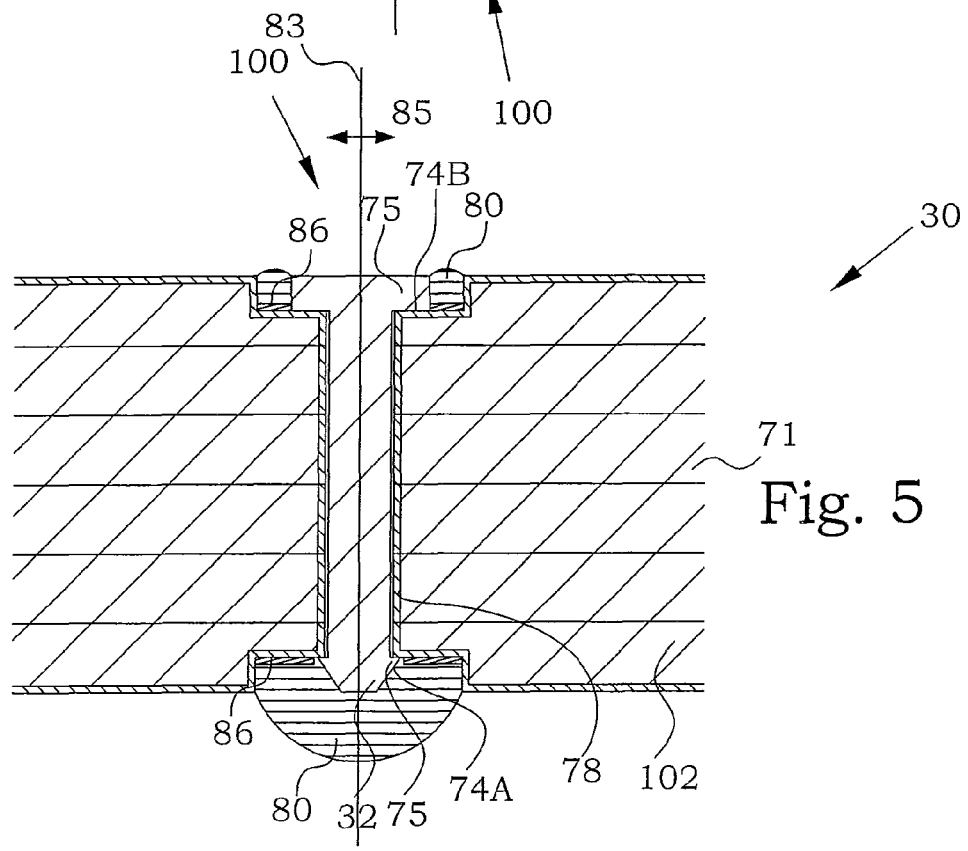
FIG. 5 is a schematic drawing of yet another embodiment of a wafer assembly according to the present invention.

In FIG. 5, the electrical connection 32 of the via 100 is inserted through a substrate 71 being constituted by a multi-wafer stack 102. In this embodiment, the protrusions 75, i.e. retaining structures 74A at one end are small enough to be forced through the hole 84. However, the protrusions 75, i.e. the retaining structures 74B at the other end are larger, ensuring an even more safe mechanical mounting. By such an arrangement, the via 100 can be provided after the high-temperature bonding of the multiwafer stack 102.

Another variant is to insert the electrical connection through the hole 84 the before the surface of the substrate confining the hole is made electrically insulating. If the insulating layer is provided by oxidation of the underlying substrate material, the electrically insulating layer will add volume to the substrate. This can be utilised for providing a hole with smaller dimensions than the electrical connection protrusion. By oxidizing the substrate, the hole diameter can thus be made smaller after the insertion of the electric connection. However, parts of the electric connection that is supposed to be conducting in the final arrangement has to be protected from oxidation.

Figure 6:
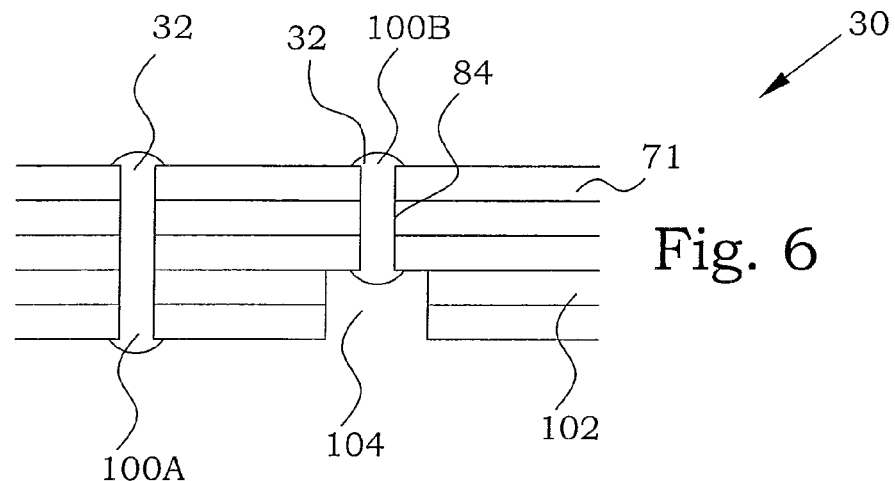
FIG. 6 is a schematic drawing of embodiments of a wafer assembly having electrical connections penetrating a subset of wafers in a stack of wafers.

In FIG. 6, a stack of wafers 102 is shown in cross section. A first via 100A is provided through the entire stack of wafers 102, while a second via 100B only passes through three of the wafers. One end of the second via 100B thus ends within the stack. The hole used for the electrical connection thus penetrates a subset of the wafers of the stack of wafers 102. The solder material for this can be provided through an additional hole 104, and the final soldering process can be provided by using the metallisation around the via hole 84. It is thus easy also to provide vias between arbitrary planes of the wafer stack by using the present principles.

Figure 7:
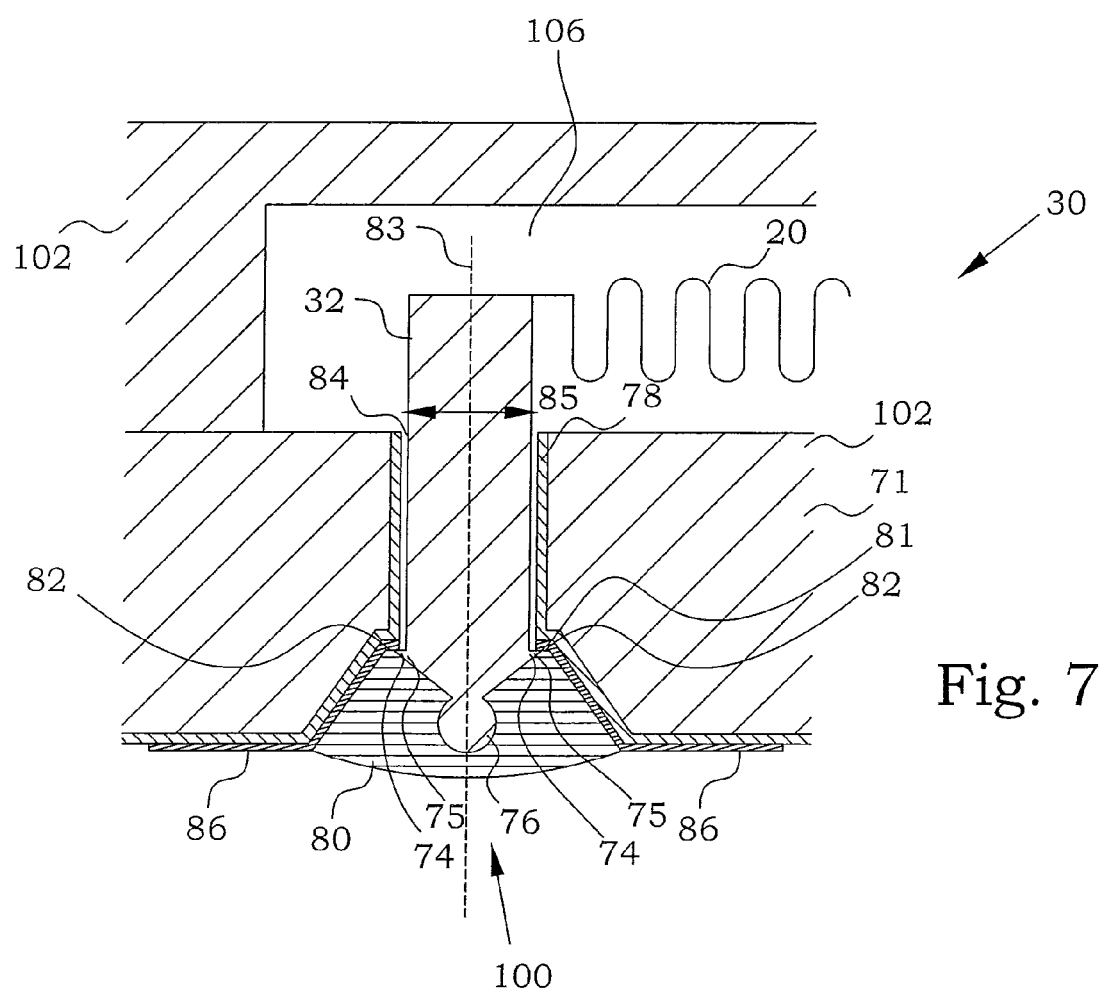
FIG. 7 is a schematic drawing of an embodiment of a wafer assembly according to the present invention entering a cavity.

Electrical connections into cavities of a stack of wafers can also easily be provided. In FIG. 7, the stack of wafers 102 comprises two wafers 100. The upper wafer has a recess, creating a cavity 106 in which the heater microstructure 20 is contained. The heater microstructure 20 and the electrical connection 32 can be inserted through the hole 84 before the upper wafer is provided, and is present during the bonding process. In case the cavity is to be evacuated, such an evacuation can be performed before providing the soldering. The electrical connection 32 is soldered only from the outside, which easily can be performed after the wafer bonding.

Figure 8:
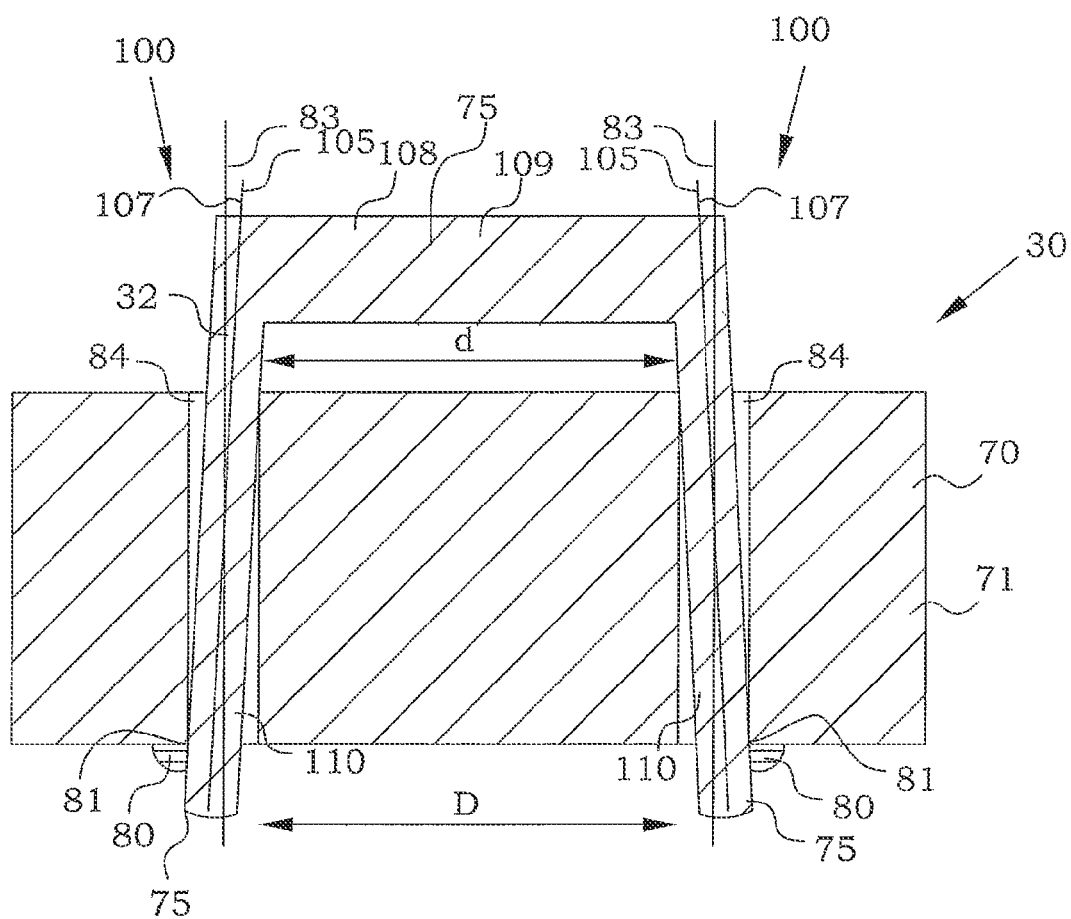
FIG. 8 is a schematic drawing of an embodiment of a wafer assembly according to the present invention being tilted with respect to the hole.

FIG. 8 illustrates an embodiment of a wafer assembly 30 with an electrical connection 32 of a via 100 is provided through a hole in a tilted direction 105, e.g. with a non-zero angle 107 with respect to the main extension 83 of the hole 84. Protrusions 75 are thereby formed by the tilted ends of the electrical connection 32. These protrusions 75 support against support surfaces 81, in the present embodiment, an area around the edge of the hole 84. The tilted direction is in this embodiment provided by means of a connection 108, in this embodiment a bridge section 109 to a neighbouring via. The distance d of the combined electrical connection 32 between the two legs 110 is made somewhat smaller than the actual distance D between the holes 84. When pushing the legs 110 into the holes 84, the electrical connection 32 will be distorted giving a somewhat tilted configuration. Note, however, that all angles in FIG. 8 are exaggerated in order to explain the principles of the tilting. In practice, the useful angles are very small. The bridge section 109 also forms a protrusion 75, which prohibits the electrical connection 32 to be removed in a downward direction (in the Fig.).

Anyone skilled in the art realises from the above embodiment that this principle can further utilised for connecting more than two legs. In such a way, an efficient mounting of the small electrical connections 32 can be achieved. One may also originally provide the electrical connections 32 as connected legs and after soldering the vias remove the mechanical connections between the legs, e.g. by providing weak portions at the mechanical connection which easily breaks.

Figure 9:
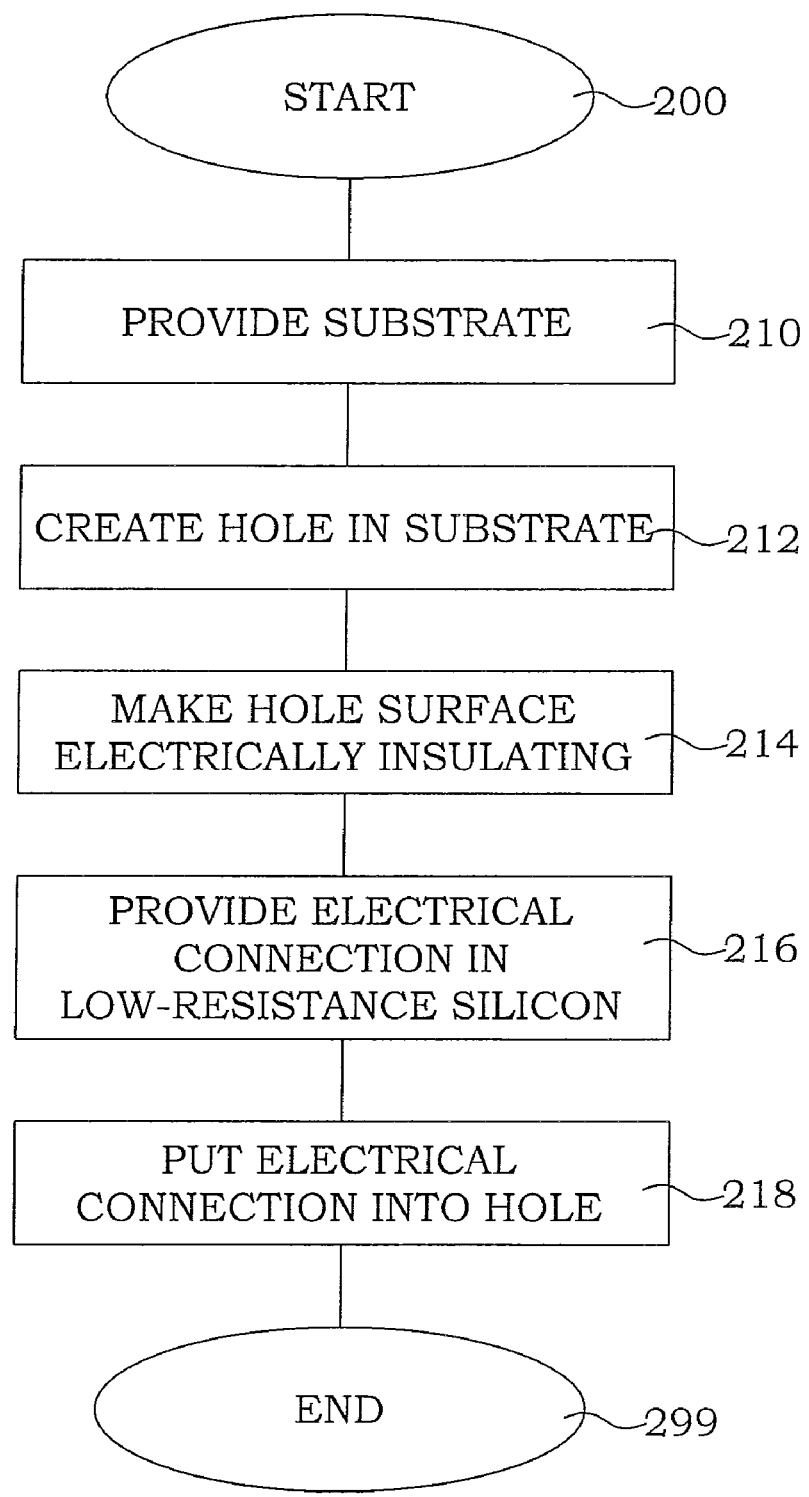
FIG. 9 is a flow diagram of steps of an embodiment of a method according to the present invention.

An embodiment of a method according to the present invention is illustrated in FIG. 9. Such method is implicitly already described when discussing the different embodiments above, but may be summarised as follows. A method for manufacturing of an electrical connection through a substrate begins in step 200. In step 210, a substrate is provided, comprising a wafer or a stack. A hole penetrating at least a part of the substrate is created in step 212, and in step 214, a surface of the substrate confining the hole is made electrically insulating. If the substrate already is electrically insulating, this step becomes integrated in step 212. In step 216, an electrical connection is provided in low-resistance silicon. The electrical connection is put into the hole in step 218, which leads to an arranging of a protrusion of the electrical connection, protruding transversal to a main extension of the hole, for protruding outside a minimum hole diameter as projected in the main extension of the hole. The procedure ends in step 299.

Since the electrical connection 32 is or at least can be manufactured separately from the substrate and being inserted into the holes mechanically afterwards, there is no absolute need to use the same material in both the substrate 71 and the electrical connection 32. The material of the substrate may e.g. be of another type or quality of silicon. The substrate may even be of another conducting, semiconducting or insulating material. In case insulating materials are used in the wafers, the insulating surface of the hole is automatically provided, which reduces the need with one manufacturing process step.

The embodiments described above are to be understood as a few illustrative examples of the present invention. It will be understood by those skilled in the art that various modifications, combinations and changes may be made to the embodiments without departing from the scope of the present invention. In particular, different part solutions in the different embodiments can be combined in other configurations, where technically possible. The scope of the present invention is, however, defined by the appended claims.

The wafer assemblies according to the present invention can be used in many different application, from pure electronically systems to complex MEMS systems. The advantages are present in all types of applications, but are particularly pronounced when applied to multiwafer arrangements and/or MEMS systems.

The invention claimed is:

1. Wafer assembly, comprising: a substrate comprising a wafer or a stack of wafers; and an electrical connection arranged through at least a part of said substrate, wherein said electrical connection is made by low-resistance silicon, wherein said electrical connection is provided separately from said substrate with at least one protrusion and mechanically positioned in a hole of said substrate afterwards, penetrating at least a part of said substrate, wherein a surface of said substrate confining said hole is electrically insulating, wherein at least one protrusion of said electrical connection protrudes transversal to a main extension of said hole, wherein said protrusion is protruding outside a minimum hole diameter as projected in said main extension of said hole, wherein said protrusion is supported by a support surface of said substrate; wherein said support surface of said substrate is a recessed surface portion of said substrate; wherein at least one end of said electrical connections is contained within a main surface plane of the wafer or stack of wafers; wherein an end of said electrical connection is soldered to said support surface; wherein the solder material surrounds at least one said protrusion, and is in direct contact with at least a portion of said support surface.

2. Wafer assembly according to claim 1, wherein said protrusion is a hook having a surface transversal to said main extension of said hole facing towards said minimum hole diameter.

3. Wafer assembly according to claim 1, wherein said electrical connection is tilted by a non-zero angle with respect to said main extension of said hole.

4. Wafer assembly according to claim 1, wherein said support surface is a metallised surface.

5. Wafer assembly according to claim 1, wherein said electrical connection has a protrusion at each side of said hole in a direction of said main extension of said hole.

6. Wafer assembly according to claim 1, wherein said substrate is a stack of wafers and said hole penetrates a subset of wafers of said stack of wafers.

7. Wafer assembly according to claim 6, wherein at least one end of said electrical connection ends within a cavity of said stack of wafers.

8. Wafer assembly according to claim 1, wherein said surface of said substrate confining said hole is covered with silicon oxide.

9. Wafer assembly according to claim 1, wherein only one end of said electrical connection protrudes outside a main surface of said substrate.

10. Wafer assembly according to claim 1, wherein said protrusion constitutes at least a part of a connection to a neighbouring via.

11. Wafer assembly according to claim 1, wherein said substrate is made by another material than said electrical connection.

12. Method for manufacturing of an electrical via through a substrate, said method comprising the steps of: providing a substrate comprising a wafer or a stack of wafers; creating a hole penetrating at least a part of said substrate; making a surface of said substrate confining said hole electrically insulating; creating an electrical connection, in low-resistance silicon separately from said substrate and entirely outside said hole, said electrical connection being created with a protrusion; and inserting, after the step of providing the electrical connection is fully completed, said electrical connection, having said protrusion/into said hole said step of inserting comprising arranging said protrusion to protrude transversal to a main extension of said hole with said protrusion protruding outside a minimum hole diameter as projected in said main extension of said hole.

13. Method according to claim 12, comprising the further step of supporting said protrusion by a support surface of said substrate.

14. Method according to claim 13, comprising the further step of soldering said electrical connection to said support surface.

15. Method according to claim 12, wherein the step of making said surface of said substrate confining said hole electrically insulating comprises oxidizing said surface of said substrate.

16. Method according to claim 12, comprising the further step of metallising a part of said surface of said substrate confining said hole.

17. Method according to claim 12, wherein said substrate is made in another material than said electrical connection.

18. Method according to claim 15, wherein said oxidizing takes place after said step of putting said electrical connection into said hole.

19. A method for manufacturing of an electrical via through a substrate, said method comprising the steps of: providing a substrate comprising a wafer; creating a hole penetrating through the substrate with a surface of the substrate confining the created hole, the hole having a main extension, the hole having a minimum first hole diameter at a first location and a second hole diameter at a second location defining a recess part of the hole, the second hole diameter being larger than the minimum first hole diameter; oxidizing the surface of the substrate confining the hole electrically to make interior surfaces defining the hole electrically insulating; providing an electrical connection of low-resistance silicon, the electrical connection having a protrusion, the electrical connection, including the protrusion, being provided entirely outside of the substrate and entirely outside the hole of the substrate; and after said providing the electrical connection step is fully completed, mechanically mounting the electrical connection into the hole, said mounting step including arranging the protrusion to protrude i) transversal to the main extension of the hole and ii) be located at the second location having the second hole diameter projecting in the main extension of the hole, wherein after said mounting step, the electrical connection defines an electrical via, and wherein the electrical connection is a material different from a material of the substrate.

* * * * *

UNITED STATES PATENT AND TRADEMARK OFFICE
CERTIFICATE OF CORRECTION

PATENT NO. : 8,395,057 B2
APPLICATION NO. : 12/439568
DATED : March 12, 2013
INVENTOR(S) : Pelle Rangsten et al.

Page 1 of 1

It is certified that error appears in the above-identified patent and that said Letters Patent is hereby corrected as shown below:

In the Claims:

In claim 12, column 8, line 14, please replace "/" after "protrusion" with --,--

Signed and Sealed this
Thirtieth Day of April, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,395,057 B2  Page 1 of 1
APPLICATION NO. : 12/439568
DATED : March 12, 2013
INVENTOR(S) : Rangsten et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 511 days.

Signed and Sealed this

First Day of September, 2015

Michelle K. Lee
*Director of the United States Patent and Trademark Office*